United States Patent
Tatematsu et al.

(10) Patent No.: US 6,686,644 B2
(45) Date of Patent: Feb. 3, 2004

(54) SEMICONDUCTOR DEVICE PROVIDED WITH FUSE AND METHOD OF DISCONNECTING FUSE

(75) Inventors: Tsutomu Tatematsu, Kawasaki (JP); Kengi Togashi, Kawasaki (JP); Masayuki Nakada, Kawasaki (JP); Toyoji Sawada, Kawasaki (JP); Kazuo Sukegawa, Kawasaki (JP); Tomoyuki Yamada, Kawasaki (JP); Yoshikazu Arisaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/103,195

(22) Filed: Mar. 22, 2002

(65) Prior Publication Data

US 2002/0153588 A1 Oct. 24, 2002

(30) Foreign Application Priority Data

Apr. 24, 2001 (JP) .................................. 2001-126046
Feb. 21, 2002 (JP) .................................. 2002-044950

(51) Int. Cl.$^7$ .......................... H01L 29/00; H01L 27/10
(52) U.S. Cl. ...................... 257/529; 257/530; 257/211; 438/132; 438/215
(58) Field of Search ........................... 257/530, 529, 257/665, 209, 211, 193; 438/132, 215, 281, 333, 467, 601, 128, 129, 131; 337/290, 295, 292, 297

(56) References Cited

U.S. PATENT DOCUMENTS 6,218,721 B1 * 4/2001 Niwa ........................ 257/529
6,300,232 B1 * 10/2001 Satoh ........................ 438/601
2002/0063305 A1 * 5/2002 Koike ....................... 257/529

FOREIGN PATENT DOCUMENTS

| JP | 9-36234 | 2/1997 |
| JP | 10-261720 | 9/1998 |
| JP | 11-97542 | 4/1999 |
| JP | 2000-68377 | 3/2000 |

* cited by examiner

Primary Examiner—Steven Loke
Assistant Examiner—Donghee Kang
(74) Attorney, Agent, or Firm—Staas & Halsey

(57) ABSTRACT

A high-strength protective member made of tungsten is disposed under a disconnecting point of a fuse. This protective member is formed simultaneously with formation of a via contact portion which connects the fuse with wiring, for example.

13 Claims, 13 Drawing Sheets

SEMICONDUCTOR DEVICE PROVIDED WITH FUSE AND METHOD OF DISCONNECTING FUSE

CROSS-REFERENCE TO RELATED APPLICATIONS

This application is based upon and claims priority of Japanese Patent Applications No. 2001-126046, filed in Apr. 24, 2001 and No. 2002-044950, filed in Feb. 21, 2002, the contents being incorporated herein by reference.

BACKGROUND OF THE INVENTION

1. Field of the Invention

The present invention relates to a semiconductor device provided with a fuse to be disconnected by a laser and to a method of disconnecting a fuse provided on a semiconductor circuit.

2. Description of the Prior Art

As higher performance of semiconductor devices are required in recent years, downsizing and higher integration of elements are accelerated. However, more defects tend to occur as downsizing and higher integration of the elements progress, thus incurring a drop in fabrication yields. In order to avoid the foregoing, a redundant circuit is sometimes provided inside a semiconductor device. The semiconductor device provided with such a redundant circuit is generally designed to use a fuse in order to switch a defective circuit to the redundant circuit.

FIG. 1 is a view showing one example of a method of switching circuits with a fuse.

A redundant circuit 51 has a constitution identical to that of a basic circuit 52. This redundant circuit 51 is connected with a contact point a of a switch circuit 53 and the basic circuit 52 is connected with a contact point b of the switch circuit 53. A center tap c of the switch circuit 53 is connected with a buffer 54. Moreover, a control terminal s of the switch circuit 53 is connected with a node N between a resistor R and a fuse F. The resistor R and the fuse F are serially connected between a power source line Vh and a ground line Vgnd.

When the fuse is not disconnected, the electric potential of the control terminal s of the switch circuit 53 is equal to the electric potential of the ground line Vgnd (which is referred to as a "L" level), and the center tap c of the switch circuit 53 is connected with the contact point b. Therefore, the buffer 54 is electrically connected with the basic circuit 52 and electrically separated from the redundant circuit 51.

When the basic circuit 52 is defective, the fuse F is disconnected by a laser. Accordingly, the electric potential of the control terminal s of the switch circuit 53 is made equal to the electric potential of the power source line Vh (which is referred to as a "H" level), whereby the center tap c and the contact point a are connected. Therefore, the buffer 54 is electrically connected with the redundant circuit 51 and electrically separated from the basic circuit 52.

In this way, the defective circuit can be switched into the redundant circuit by disconnecting the fuse F by a laser.

FIG. 2 is a cross-sectional view showing a conventional semiconductor device provided with a fuse. An insulating film 62 is formed on a semiconductor substrate 61, and lower wiring including lines 63a and 63b is formed on this insulating film 62. Another insulating film 64 is formed on both of the insulating film 62 and the lower wiring, and a fuse 65 is formed on the insulating film 64. Both ends of this fuse 65 are electrically connected with the lower lines 63a and 63b severally through via contact portions 64a and 64b formed inside the insulating film 64. Another insulating film 66 is formed on both of the insulating film 64 and the fuse 65.

In the semiconductor device thus constituted, a laser is irradiated onto the center portion of the fuse 65 via the insulating film 66 when the fuse 65 is disconnected. In this way, the center portion of the fuse 65 irradiated by the laser is heated up above the melting point thereof and changed from a solid phase to a liquid phase or a gas phase, and a sudden rise of pressure causes a so-called thermal explosion. The fuse 65 is disconnected by this thermal explosion, and a part of the insulating film 66 (an upper part of the disconnected portion of the fuse) is exfoliated as shown in FIG. 3.

The inventers of the present invention perceive that the above-described conventional semiconductor device and the method of disconnecting the fuse bear the following problem.

As described above, the thermal explosion occurs upon disconnecting the fuse 65 by the laser. In this event, large pressure is also applied to the insulating film 64 under the fuse 65, whereby a part of the insulating films 64 and 62 may be exfoliated and a crack may also occur in the insulating film 64 and 62. When damages such as exfoliation or cracks occur in the insulating films 64 and 62, water may easily infiltrate into the semiconductor substrate 61 and a wiring layer, thus causing deterioration of characteristics.

Incidentally, Japanese Patent Laid-Open No. Hei 9 (1997)-36234 discloses a fuse, which is composed of first and second fuse elements disposed vertically via an insulating film, and a contact portion which connects tip portions of these first and second fuse elements electrically. Moreover, Japanese Patent Laid-Open No. Hei 9 (1997)-36234 also discloses a fuse, in which the first and the second fuse elements are formed in the same layer, whereby the fuse is composed by electrically connecting the first and the second fuse elements with the contact portion. These fuses are designed as surely disconnectable by irradiating a laser onto the contact portion.

Meanwhile, Japanese Patent Laid-Open No. Hei 4 (1992)-14245 discloses a fuse composed of a partially thinned aluminum line, in which a member easily heated by a laser (a heating member) such as a polysilicon film is disposed under the fuse. According to the publication, the fuse made of aluminum can be surely disconnected by means of heating the heating member by the laser to cause thermal explosion.

However, the fuses disclosed in those publications cannot yet avoid damages on insulating films under the fuses upon disconnection.

SUMMARY OF THE INVENTION

An object of the present invention is to provide a semiconductor device and a method of disconnecting a fuse capable of reducing damages on an insulating film under a fuse upon disconnecting the fuse by a laser.

A semiconductor device according to the present invention includes a semiconductor substrate, an insulating film formed on the semiconductor substrate, a fuse formed on the insulating film, and a protective member formed stronger than the insulating film and disposed under a disconnecting point of the fuse.

In the semiconductor device of the present invention, the high-strength protective member is disposed under the disconnecting point of the fuse. When a laser is irradiated on the disconnecting point of the fuse, the temperature at the disconnecting point is suddenly increased and thermal explosion occurs. In this event, the protective member protects the lower insulating film, whereby occurrence of damages such as exfoliation and cracks can be prevented. Moreover, as the thermal explosion occurs on the high-strength protective member, destructive pressure is concentrated on an upper side of the protective member. In this way, the fuse can be efficiently disconnected. In addition, a form of destruction of the fuse is also stabilized.

Only one protective member may be disposed per fuse, or a plurality of protective members may be also disposed. Moreover, in the case of a semiconductor device provided with a plurality of fuses, it is preferable that the fuses are arrayed within a certain area in consideration of operating efficiency upon disconnection of the fuses.

A method of disconnecting a fuse according to the present invention is a method of disconnecting a fuse of a semiconductor device including a semiconductor substrate, a first insulating film formed on the semiconductor substrate, wiring formed on the first insulating film, a second insulating film formed on the first insulating film and the wiring, a fuse formed on the second insulating film, and a via contact portion formed inside the second insulating film to connect the fuse and the wiring electrically, in which the fuse is disconnected by irradiating a laser onto a connective portion of the fuse to the via contact portion.

According to the present invention, the via contact portion is also used as the protective member, whereby the fuse is disconnected by irradiating the laser onto the connective portion of the fuse to the via contact portion. In this way, the via contact portion protects the insulating film under the fuse, whereby occurrence of damages such as exfoliation and cracks can be prevented.

Moreover, another method of disconnecting a fuse according to the present invention is a method of disconnecting a fuse of a semiconductor device including a semiconductor substrate, a first insulating film formed on the semiconductor substrate, wiring formed on the first insulating film, a second insulating film formed on the first insulating film and the wiring, a fuse formed on the second insulating film, a via contact portion formed inside the second insulating film to connect the fuse and the wiring electrically, and a plurality of protective members formed stronger than the second insulating film and disposed separately from one another under the fuse, in which the fuse is disconnected by severally irradiating a laser onto at least one of portions directly above the protective member out of a plurality of the protective numbers.

According to the present invention, the plurality of protective members are provided under the fuse. Then, upon disconnection of the fuse, the laser is irradiated onto upper portions of these protective members. In other words, the fuse is disconnected at a plurality of portions. In this way, the fuse can be surely disconnected. Moreover, upon irradiation of the laser, each of the protective members protects the insulating film under the fuse, whereby occurrence of damages such as exfoliation and cracks can be prevented.

The fuse may be also disconnected by irradiating the laser onto a portion between the protective members. In this case, the insulating film under the fuse is also protected by the respective protective members, whereby occurrence of damages such as exfoliation and cracks can be prevented.

DESCRIPTION OF THE PREFERRED EMBODIMENTS

Now, the preferred embodiments of the present invention will be described with reference to the accompanying drawings.

(First Embodiment)

Figure 1:
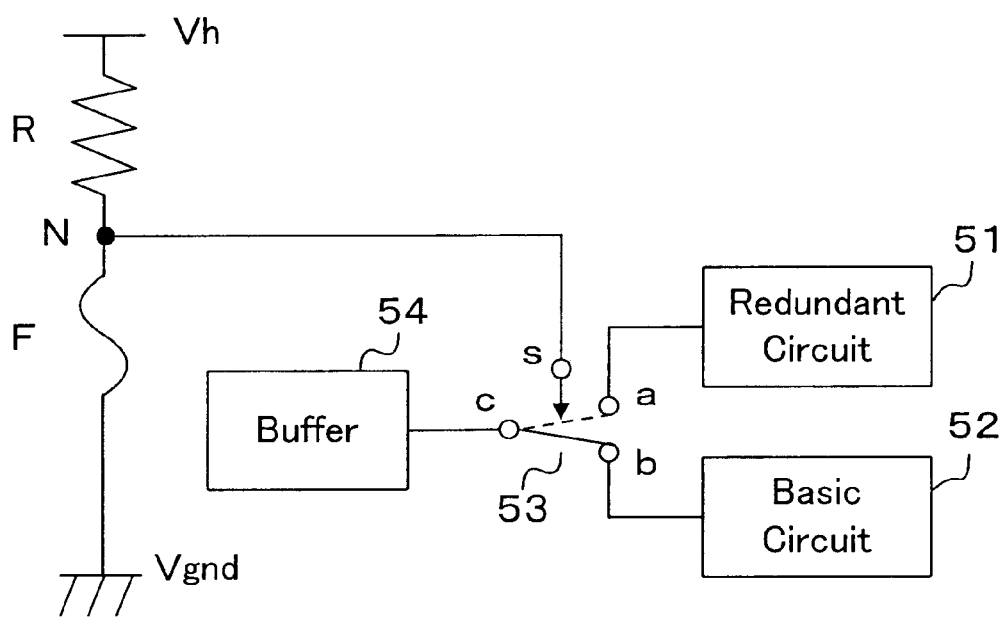
FIG. 1 is a view showing one example of a method of switching circuits with a fuse.
Figure 2:
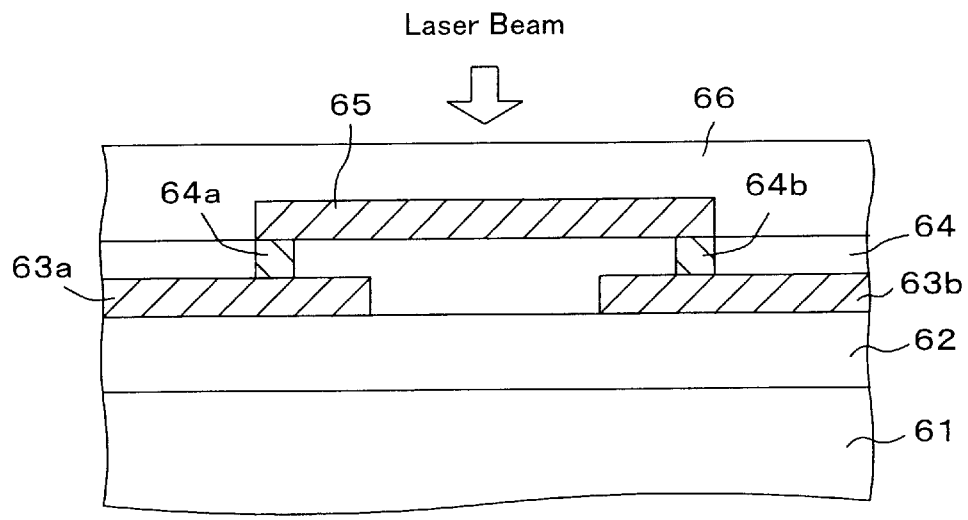
FIG. 2 is a cross-sectional view of a conventional semiconductor device provided with a fuse.
Figure 3:
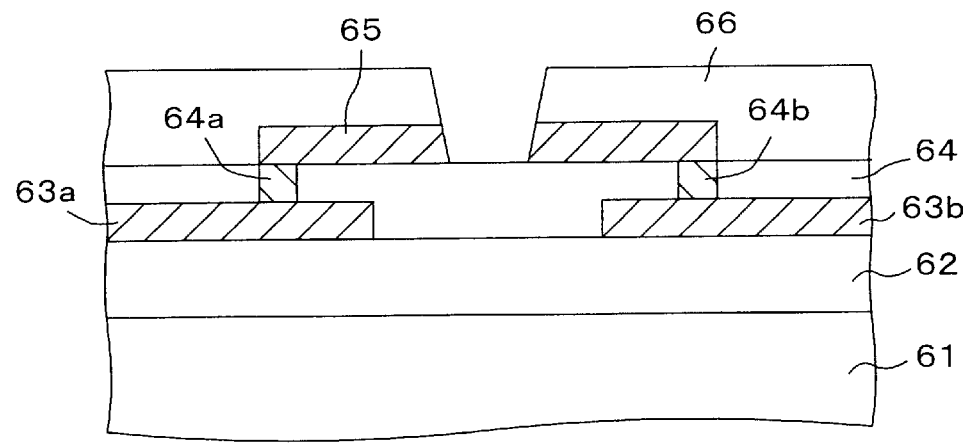
FIG. 3 is a cross-sectional view of the conventional semiconductor device after disconnection of the fuse.
Figure 4:
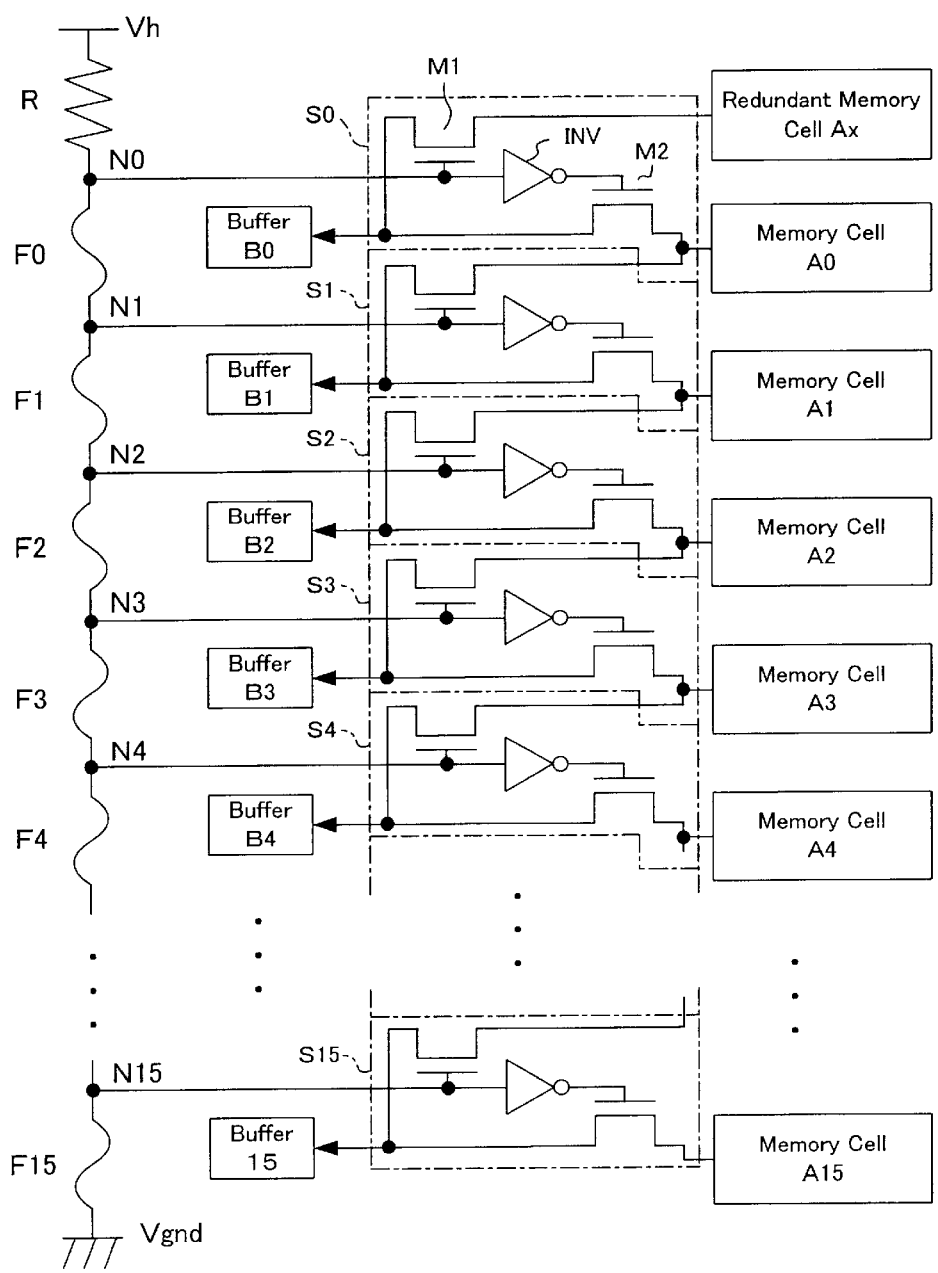
FIG. 4 is a block diagram showing a first embodiment of the present invention applied to a semiconductor memory device.

FIG. 4 is a block diagram showing a first embodiment of the present invention applied to a semiconductor memory device.

In the semiconductor memory device of this embodiment, one set of memory cell unit consists of sixteen memory cells A0 to A15. Moreover, in the semiconductor memory device, provided for each memory cell unit are one redundant memory cell Ax, sixteen switch circuits S0 to S15, sixteen buffers B0 to B15, one resistor R and sixteen fuses F0 to F15. Such a set of memory cell unit stores 16 bits of data.

Either one out of the redundant memory cell Ax or the memory cell A0 is connected with the buffer B0 by a switch circuit S0. Meanwhile, either one out of the memory cell A0 or the memory cell A1 is connected with the buffer B1 by the switch circuit S1. Likewise, either one out of the memory cell An-1 (provided that n is an arbitrary integer in a range from 1 to 15) or the memory cell An is connected with the butter Bn by the switch circuit Sn.

Each of the switch circuits S0 to S15 is composed of one inverter INV and two switching elements M1 and M2. In this embodiment, both of the switching elements M1 and M2 are composed of metal-oxide semiconductor (MOS) transistors. A gate of the switching element M1 is connected with an input terminal of the inverter INV, and a gate of the switching element M2 is connected with an output terminal of the inverter INV.

The resistor R and the fuses F0 to F15 are serially connected between a power source line (+Vh) and a ground line (Vgnd). A control terminal of the switch circuit S0, that is, a node of the input terminal of the inverter INV and the gate of the switching element M1 is connected with a node (N0) between the resister R and the fuse F0.

When electric potential of the node N0 is at the "L" level, the switching element M1 inside the switch circuit S0 is turned off and the switching element M2 is turned on, whereby the redundant memory cell Ax is electrically separated from the buffer B0 and the memory cell A0 is connected with the buffer B0. Moreover, when the electric potential of the node N0 is at the "H" level, the switching element M1 inside the switch circuit S0 is turned on and the switching element M2 is turned off, whereby the redundant memory cell Ax is electrically connected with the buffer B0 and the memory cell A0 is electrically separated from the buffer B0.

Likewise, regarding the switch circuit Sn (provided that n is an arbitrary integer in a range from 1 to 15), the buffer Bn and the memory cell An are electrically connected when the electric potential of the node Nn between the fuse Fn-1 and the fuse Fn is at the "L" level, and the buffer Bn and the memory cell An-1 are electrically connected when the electric potential of the node Nn is at the "H" level.

When there is no defect among the memory cells A0 to A15, none of the fuses F0 to F15 is disconnected; therefore, the electric potential of the nodes N0 to N15 is at the "L" level, respectively. Accordingly, in the switch circuits S0 to S15, the switching elements M1 are turned off and the switching elements M2 are turned on. As a consequence, the buffer B0 is electrically connected with the memory cell A0, the buffer B1 is electrically connected with the memory cell A1, and the buffer Bn is electrically connected with the memory cell An.

If the memory cell A3 turns out to be defective by inspection, for example, then the fuse F3 will be disconnected by a laser. In this way, the electric potential of the nodes N0 to N3 is changed to the "H" level; meanwhile, the electric potential of the nodes N4 to N15 remains at the "L" level. As a result, regarding the switch circuits S0 to S3, the switching elements M1 are turned on and the switching elements M2 are turned off. In other words, the buffer B0 is connected with the redundant memory cell Ax, the buffer B1 is connected with the memory cell A0, the buffer B2 is connected with the memory cell A1, and the buffer B3 is connected with the memory cell A2.

In the meantime, as the electric potential of the nodes N4 to N15 remains at the "L" level, the buffer B4 is connected with the memory cell A4; and likewise, the buffer Bm (m is an arbitrary integer in a range from 4 to 15) is connected with the memory cell Am. In this way, the memory cell unit can retain 16-bit data without using the defective memory cell A3.

Figure 5A:
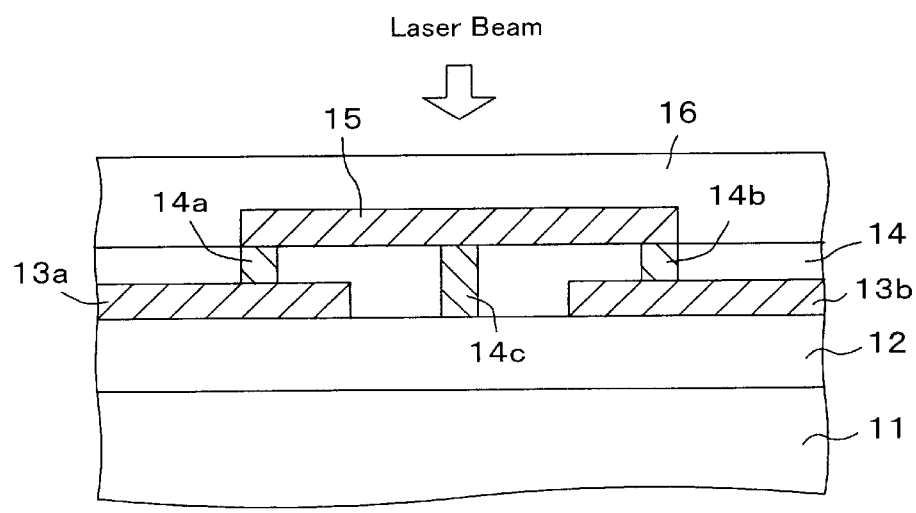
FIG. 5A is a cross-sectional view of the semiconductor device of the first embodiment taken in the longitudinal direction of the fuse thereof.
Figure 5B:
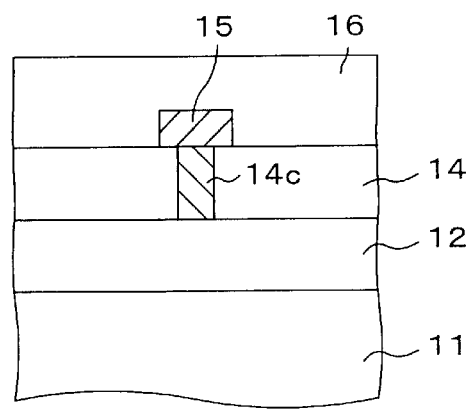
FIG. 5B is a cross-sectional view of the same taken along a width direction of the fuse thereof.

FIGS. 5A and 5B are cross-sectional views showing a structure of a fuse-forming portion of the semiconductor device of this embodiment. FIG. 5A shows a cross section in the longitudinal direction of the fuse and FIG. 5B shows a cross section in the width direction of the fuse.

Transistors, resistors (none of those are illustrated) and the like are formed on a semiconductor substrate 11 in order to constitute the circuit as shown in FIG. 4. Moreover, an insulating film 12 made of silicon oxide, for example, is formed on the semiconductor substrate 11, and lower wiring including lines 13a and 13b is formed on the insulating film 12. The lower wiring is made of aluminum or an aluminum alloy (hereinafter simply referred to as "the aluminum"), or other metallic materials. Note that the insulating film 12 may be also made of phospho-silicate glass (PSG), fluoro-silicate glass (FSG) or other materials.

An insulating film 14 made of silicon oxide is formed on both of the insulating film 12 and the lower wiring. Moreover, a fuse 15 is formed on the insulating film 14. In this embodiment, the fuse 15 is made of aluminum. However, the material for the fuse 15 is not limited to aluminum. For example, the fuse 15 may be also made of polysilicon, copper or other materials.

Both end portions of the fuse 15 are electrically connected with the lines 13a and 13b through via contact portions 14a and 14b formed in the insulating film 14, respectively. Moreover, a protective member 14c is disposed under a disconnecting point of the fuse 15 (a portion to irradiate a laser: the central portion of the fuse in this example). These via contact portions 14a, 14b and the protective member 14c are formed by burying tungsten (W) into holes after forming the holes in predetermined portions of the insulating film 14.

It should be noted that the material for the protective member 14c is not limited to tungsten. However, it is essential that the protective member 14c possesses higher strength in comparison with the insulating films in the periphery thereof. Also, it is essential that the material for the protective member 14c possesses higher melting point than the material for the fuse 15. Moreover, although it is preferable from a viewpoint of fabrication that the protective member 14c is made of the same material as that of the via contact portions 14a and 14b, the protective member 14c may be also made of another material different from that of the via contact portions 14a and 14b. For example, the via contact portions 14a and 14b may be made of tungsten; meanwhile, the protective member 14c may be made of copper (Cu).

An insulating film 16 made of silicon oxide is formed on both of the insulating film 14 and the fuse 15.

Note that all the insulating films 12, 14 and 16 are made of silicon oxide in this embodiment. However, any of the insulating films 12, 14 and 16 may be made of another insulative material.

Figure 6A:
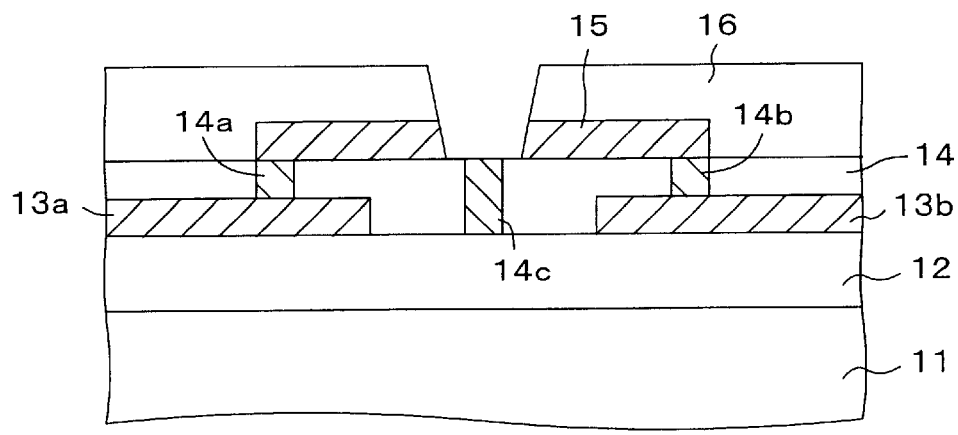
FIG. 6A is a cross-sectional view of the semiconductor device of the first embodiment after disconnection of the fuse taken in the longitudinal direction of the fuse.
Figure 6B:
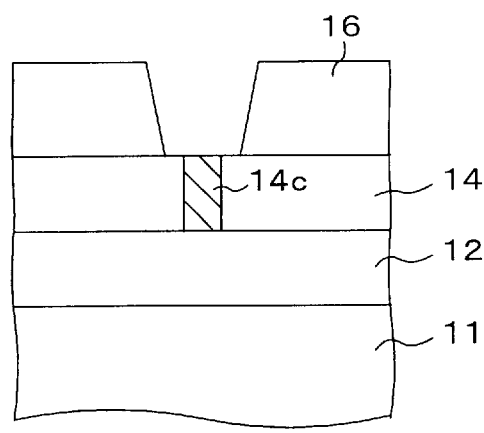
FIG. 6B is a cross-sectional view of the same taken along a width direction of the fuse.

In the semiconductor device having the above-described constitution, a laser is irradiated onto the central portion of the fuse 15 via the insulating film 16 upon disconnecting the fuse 15. In this way, the central portion of the fuse 15 is heated up above the melting point thereof, thus causing thermal explosion. Then, as shown in FIGS. 6A and 6B, the fuse 15 is disconnected and the insulating film 16 thereon is partially exfoliated.

In this event, large pressure is also applied to the structure below the disconnecting point of the fuse 15. However, in the present embodiment, since the high-strength protective member 14c made of tungsten is disposed under the disconnecting point of the fuse 15, the insulating film 14 is protected by the protective member 14c, whereby occurrence of damages such as exfoliation and cracks can be prevented.

Moreover, according to this embodiment, since thermal explosion occurs above the high-strength protective member 14c, destructive pressure is concentrated on an upper side of the protective member 14c. In this way, the fuse 15 can be efficiently disconnected and a form of destruction of the fuse 15 is also stabilized. In addition, whereas redundant energy after disconnecting the fuse may reach the semiconductor substrate 11 and impart thermal damages thereto, the protective member 14c according to this embodiment reflects or absorbs laser beams, whereby the thermal damages to the semiconductor substrate 11 can be reduced.

Figure 7A:
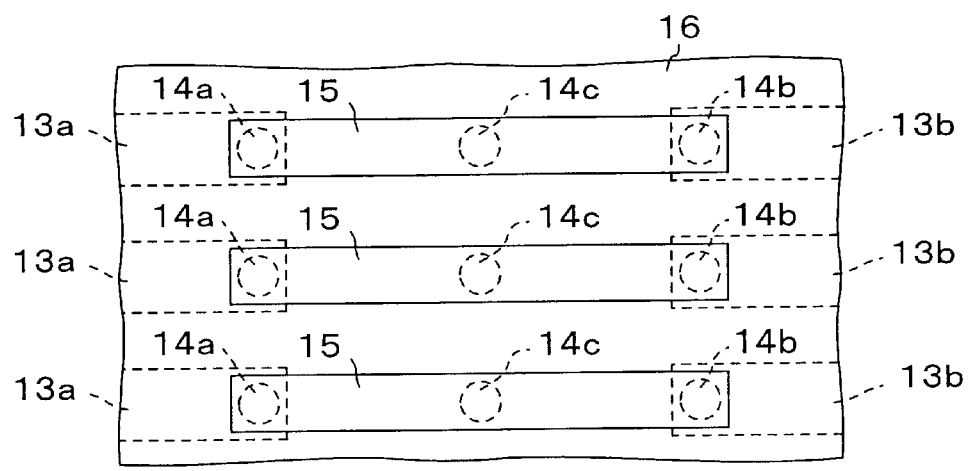
FIG. 7A is a top plan view showing one example of a semiconductor device arraying a plurality of fuses provided with protective members thereunder.
Figure 7B:
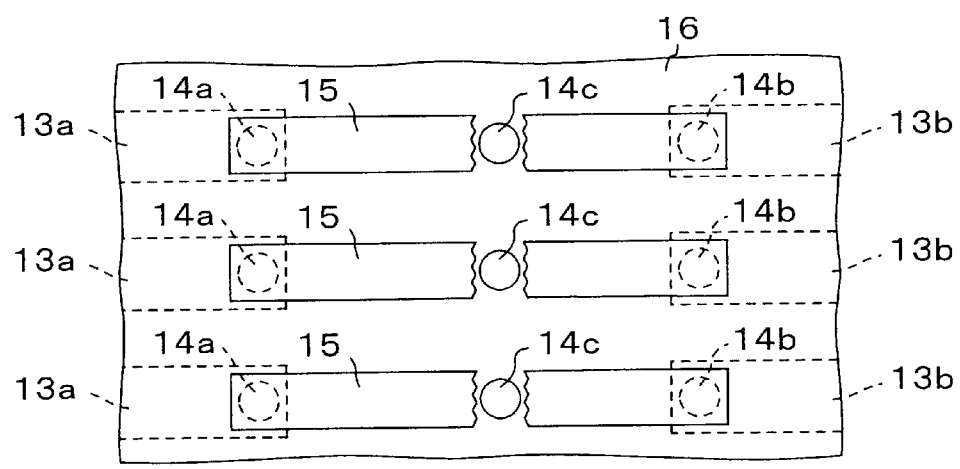
FIG. 7B is a top plan view of the same in the state that the fuses of the semiconductor device are disconnected.

FIG. 7A is a top plan view showing an example of a semiconductor device arraying a plurality of fuses provided with the protective members being disposed thereunder as described above, and FIG. 7B is a top plan view showing the same in the state that the fuses of the semiconductor device are disconnected. In FIGS. 7A and 7B, portions identical to those in FIGS. 5A and 5B or in FIGS. 6A and 6B are denoted by identical reference numerals.

As shown in FIGS. 7A and 7B, it is preferable to dispose the fuses 15 together in a predetermined region on the semiconductor substrate. In this way, an operation of disconnecting the fuses 15 can be efficiently carried out.

In the following, description will be made regarding one example of a method of fabricating a semiconductor device according to this embodiment with reference to FIGS. 5A and 5B.

First, after forming elements such as transistors on the semiconductor substrate 11, the insulating film 12 is formed on the whole upper side of the semiconductor substrate 11 by depositing silicon oxide in accordance with a chemical vapor deposition (CVD) method. Thereafter, holes are formed in predetermined positions of the insulating film 12 by use of photolithography. Then, a conductive material such as tungsten is buried into the holes, thus forming via contact portions (not shown) which are electrically connected with the elements.

Next, after forming an aluminum film on the whole upper side of the insulating film 12 by a sputtering method, the aluminum film is patterned by photolithography to form the lower wiring including the lines 13a and 13b.

Next, the insulating film 14 is formed by depositing silicon oxide on both of the insulating film 12 and the lower wiring by the CVD method. Thereafter, holes are formed in predetermined positions of the insulating film 14 by use of photolithography and then tungsten (W) is buried into the holes, whereby the via contact portions 14a and 14b and the protective member 14c are formed. Then, a surface of the insulating film 14 is subjected to planarization as necessary by chemical mechanical polishing (CMP).

Next, an aluminum film is formed on the insulating film 14, and then this aluminum film is patterned to form the fuse 15. In this event, as shown in FIG. 5A, both end portions of the fuse 15 are made to contact with the via contact portions 14a and 14b, respectively, and the disconnecting point is arranged to be disposed on the protective member 14c.

Subsequently, the insulating film 16 is formed by depositing silicon oxide on both of the insulating film 14 and the fuse 15 in accordance with the CVD method. Thereafter, the insulating film 16 above the disconnecting point of the fuse 15 is etched as necessary to thin the film thickness in the relevant portion.

In this way, the semiconductor device of this embodiment is finished. According to the method as described above, the protective member 14c is formed simultaneously with formation of the via contact portions 14a and 14b. Therefore, it is possible to fabricate the semiconductor device provided with the protective member 14c under the fuse 15 without adding a fabricating step.

Figure 8:
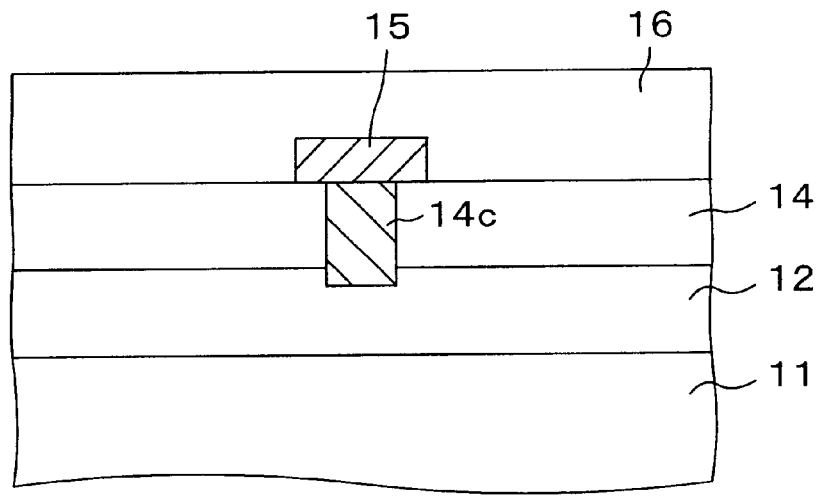
FIG. 8 is a cross-sectional view of a semiconductor device in which a bottom end of a protective member is placed below an interface of two insulating films.

When the holes are formed by etching the insulating film 14 in the above-described method, etching is virtually completed regarding forming portions of the via contact portions 14a and 14b once when the lines 13a and 13b are exposed in the holes. Meanwhile, regarding a forming portion of the protective member 14c, it is difficult to terminate etching at an interface of the insulating film 14 and the insulating film 12. As a consequence, it is probable that a bottom end of the protective member 14c is placed below the interface of the insulating film 12 and the insulating film 14 as shown in FIG. 8. Nevertheless, it does not constitute any problems if the bottom end of the protective member 14c is placed below the interface of the insulating film 14 and the insulating film 12.

Figure 9:
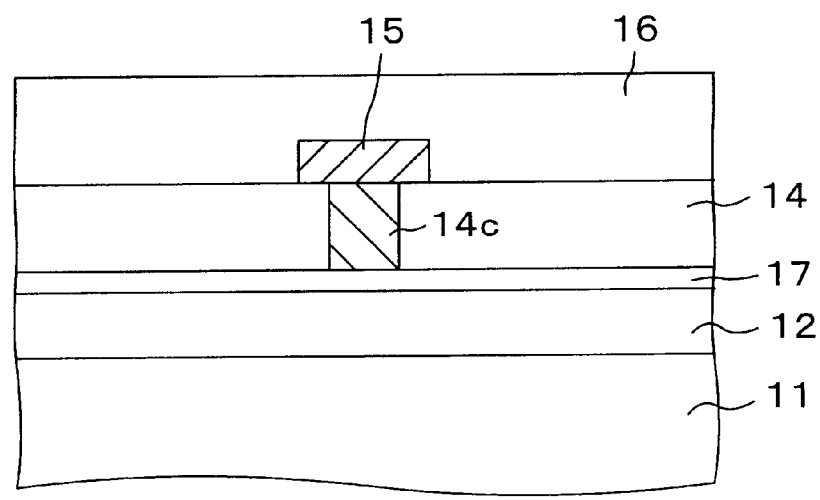
FIG. 9 is a cross-sectional view of a semiconductor device in which a protective insulating film is formed under a protective member.
Figure 10:
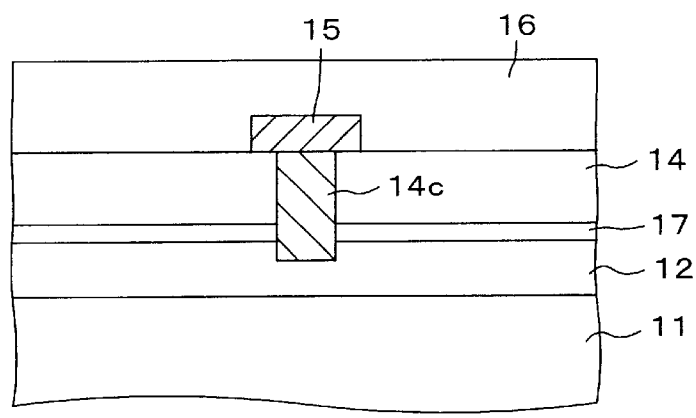
FIG. 10 is a cross-sectional view of a semiconductor device in which a bottom end of a protective member is placed below a protective insulating film.

Meanwhile, as shown in FIG. 9, there is a case to form a protective insulating film 17 with $Si_3N_4$ or the like depending on a device type, in order to avoid infiltration of water into a wiring layer or element portions. In the example as shown in FIG. 9, the protective insulating film 17 is formed between the insulating film 12 and the insulating film 14. In this case, the holes are formed by etching the insulating film 14 under a condition to raise an etching rate for the insulating film ($SiO_2$) 14 higher than that for the protective insulating film ($Si_3N_4$) 17, whereby depths of the holes can be controlled. Provided, however, that it does not constitute any problems if the bottom end of the protective member 14c is placed below the protective insulating film 17 as shown in FIG. 10.

Figure 11:
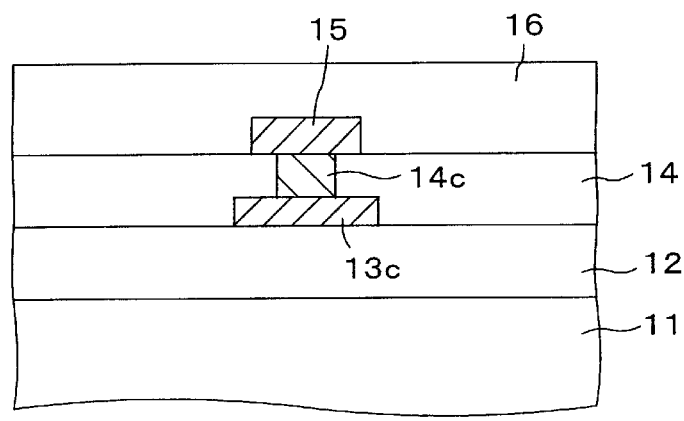
FIG. 11 is a cross-sectional view of a semiconductor device in which a stopper (a metallic film) is formed under a protective member.

Furthermore, as shown in FIG. 11, a stopper (a metallic film) 13c made of an aluminum film may be also formed under the protective member 14c in the same step to form the lines 13a and 13b. In this way, the stopper 13c can be prevented from etching to the insulating film 12 upon formation of the hole for the protective member 14c.

Figure 12:
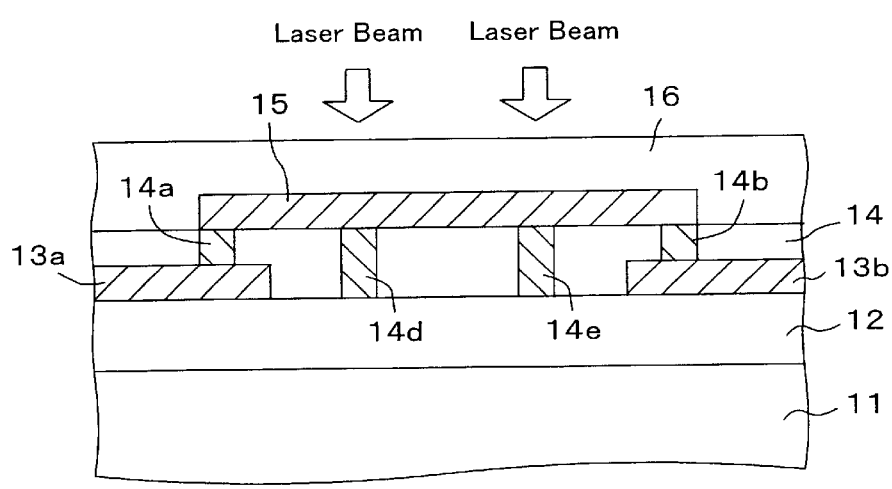
FIG. 12 is a cross-sectional view showing a modified example of the first embodiment, which is the cross-sectional view of a semiconductor device provided with a plurality of protective members.

FIG. 12 is a view showing a modified example of the first embodiment. In FIG. 12, it should be noted that portions identical to those illustrated in FIG. 5A are denoted by identical reference numerals, and detailed description thereto will be omitted.

Upon disconnecting a fuse provided on a semiconductor device, there is a case to irradiate a laser onto two or more points in order to disconnect the fuse more securely. In this embodiment, a plurality of the protective members are provided in response to a plurality of disconnecting points.

Specifically, as shown in FIG. 12, protective members 14d and 14e are formed under the disconnecting points (at two points in the drawing) of the fuse 15. These protective members 14d and 14e are formed as similarly to via contact portions 14a and 14b, by forming holes in the insulating film 14 and then burying tungsten (W) into the holes.

In the semiconductor device having a plurality of protective members for each fuse as described above, it is preferable to disconnect the fuse at the multiple points by irradiating the laser onto all the portions directly above the protective members. However, it is also possible to disconnect the fuse not by irradiating the laser onto all the portions directly above the plurality of protective members but by irradiating the laser onto at least one of the portions directly above the protective members.

Figure 13A:
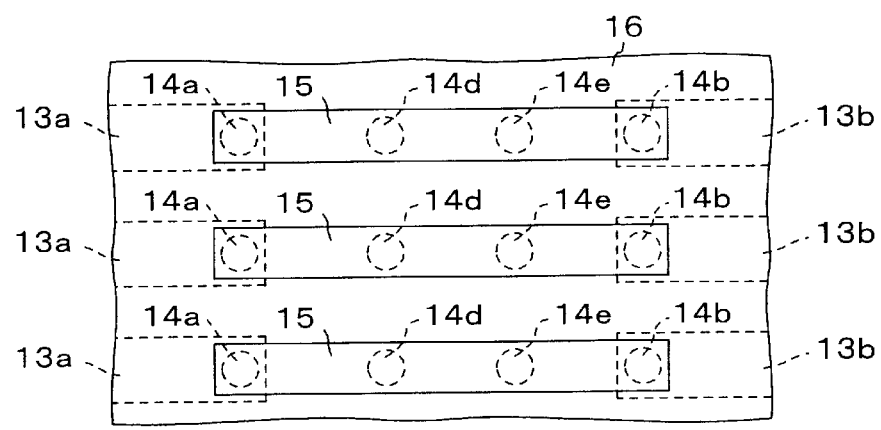
FIG. 13A is a top plan view of an example of a semiconductor device arraying a plurality of fuses provided with a plurality of protective members thereunder.
Figure 13B:
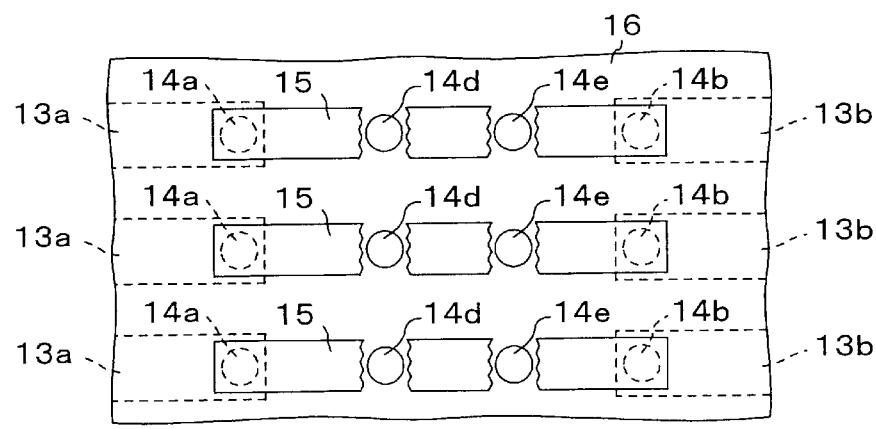
FIG. 13B is a top plan view of the same in the state that the fuses of the semiconductor device are disconnected.

FIG. 13A is a top plan view showing an example of a semiconductor device arraying a plurality of fuses provided with a plurality of protective members thereunder as described above, and FIG. 13B is a top plan view of the same in the state that the fuses of the semiconductor device are disconnected. In FIGS. 13A and 13B, portions identical to those in FIG. 12 are denoted by identical reference numerals.

As shown in FIGS. 13A and 13B, an operation to disconnect the fuses 15 can be efficiently carried out by disposing the fuses 15 together in a predetermined region on the semiconductor substrate.

(Second Embodiment)

Figure 14:
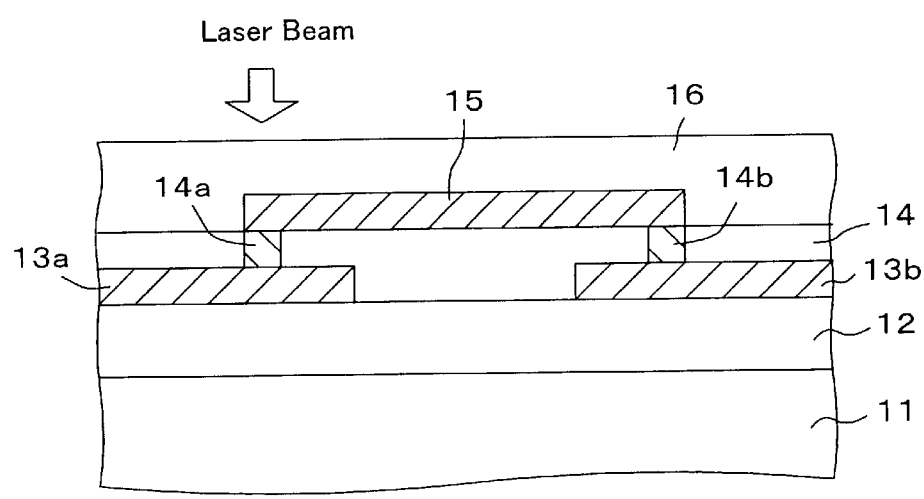
FIG. 14 is a cross-sectional view showing a method of disconnecting a fuse of a semiconductor device according to a second embodiment of the present invention.

FIG. 14 is a cross-sectional view showing a method of disconnecting a fuse of a semiconductor device according to a second embodiment of the present invention. In FIG. 14, portions identical to those in FIG. 5A are denoted by identical reference numerals, and detailed description thereto will be omitted.

In this embodiment, a via contact portion 14a connecting a fuse 15 with a lower line 13a is also used as a protective member. Specifically, according to this embodiment, an end of the fuse which is a node of the via contact portion 14a and the fuse 15 is defined as a disconnecting point. As similar to the first embodiment, tungsten is buried into the via contact potion 14a.

In this embodiment, a laser is irradiated onto the end of the fuse 15 upon disconnection of the fuse 15. In this way, the end of the fuse 15 is heated up above the melting point thereof, thus causing thermal explosion. In this event, since the via contact portion 14a of this embodiment is made of high-strength tungsten, an insulating film 14 is protected from pressure owing to the thermal explosion. Moreover, redundant energy upon disconnecting the fuse is reflected or absorbed by the via contact portion 14a, thermal damages to a semiconductor substrate 11 are reduced. In addition, since the via contact portion 14a concentrates the pressure upon the thermal explosion toward an upper side of the via contact portion 14a, the fuse 15 can be efficiently disconnected and a form of destruction of the fuse 15 is also stabilized.

(Third Embodiment)

Figure 15:
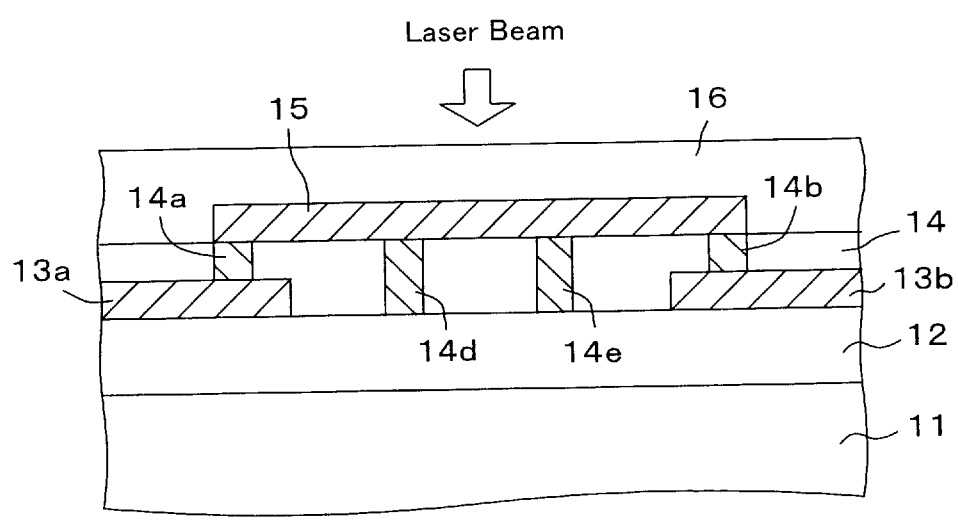
FIG. 15 is a cross-sectional view showing a method of disconnecting a fuse of a semiconductor device according to a third embodiment of the present invention.

FIG. 15 is a cross-sectional view showing a method of disconnecting a fuse of a semiconductor device according to a third embodiment of the present invention. In FIG. 15, portions identical to those in FIG. 5A are denoted by identical reference numerals, and detailed description thereto will be omitted.

In this embodiment, protective members 14d and 14e are formed in two positions in the vicinity of a disconnecting point of a fuse 15 (the central portion of the fuse) so that the protective members 14d and 14e sandwich the disconnecting point. These protective members 14d and 14e are formed as similarly to via contact portions 14a and 14b, by forming holes in an insulating film 14 and then burying tungsten (W) into the holes.

In the semiconductor device of this embodiment having the above-described constitution, a laser is irradiated between the protective members 14d and 14e upon disconnection of the fuse 15. In this embodiment, since the protective members 14d and 14e are buried into the insulating film 14, pressure attributable to thermal explosion upon disconnection of the fuse is relaxed by the protective members 14d and 14e. In this way, damages to the insulating film 14 can be suppressed.

(Fourth Embodiment)

Figure 16:
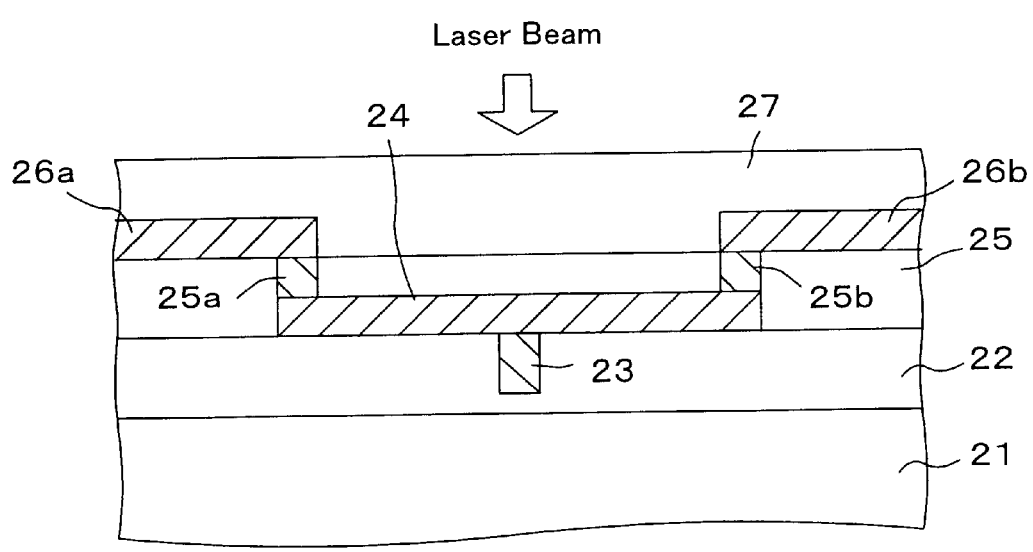
FIG. 16 is a cross-sectional view of a semiconductor device according to a fourth embodiment of the present invention.

FIG. 16 is a cross-sectional view showing a semiconductor device according to a fourth embodiment of the present invention.

An insulating film 22 made of silicon oxide is formed on a semiconductor substrate 21, and a fuse 24 is formed on this insulating film 22. A protective member 23 made of tungsten (W) is disposed under the central portion of this fuse 24. This protective member 23 is formed by burying tungsten into holes after forming the holes in the insulating film 22.

An insulating film 25 made of silicon oxide is formed on both of the insulating film 22 and the fuse 24, and upper wiring including lines 26a and 26b is formed on this insulating film 25. The lines 26a and 26b are severally connected with both end portions of the fuse 24 electrically through via contact portions 25a and 25b formed in the insulating film 25. An insulating film 27 is formed on both of the insulating film 25 and the upper wiring.

In the semiconductor device of this embodiment having the above-described constitution, a laser is irradiated onto the central portion of the fuse 24 via the insulating films 25 and 27 upon disconnection of the fuse 24. In this way, the central portion of the fuse 24 is heated up above the melting point thereof, thus causing thermal explosion. Then, the fuse 24 is disconnected and the insulating films 25 and 27 thereon are partially exfoliated.

According to this embodiment, the insulating film 22 under the fuse 24 is protected by the protective member 23, whereby occurrence of damages such as exfoliation and cracks can be prevented.

Although each of the foregoing embodiments has been described on the case that the present invention was applied to a semiconductor memory device, it should be understood that scope of application of the present invention is not limited to a semiconductor memory device. For example, the present invention is also applicable to a semiconductor device using a fuse for correcting accuracy of an analog device therein, or to a semiconductor device using a fuse for changing a circuit of logic circuits therein.

What is claimed is:

1. A semiconductor device comprising:
    a semiconductor substrate;
    a first insulating film formed on the semiconductor substrate;
    lower wiring formed on the first insulating film;
    a second insulating film formed on both of the first insulating film and the lower wiring;
    a fuse formed on the second insulating film;
    a via contact portion formed inside the second insulating film to connect the fuse and the lower wiring electrically; and
    a protective member formed of a stronger material than that of the second insulating film and disposed under the fuse with the fuse contacting the protective member.

2. The semiconductor device according to claim 1, wherein the protective member is made of the same material as the via contact portion.

3. The semiconductor device according to claim 1, wherein the protective member is made of a different material from the via contact portion.

4. The semiconductor device according to claim 1, wherein a metallic film is formed between the protective member and the first insulating film.

5. The semiconductor device according to claim 1, further comprising:

a third insulating film formed between the protective member and the first insulating film, the third insulating film being made of a different material from the second insulating film.

6. The semiconductor device according to claim 1, wherein a plurality of the protective members are disposed with respect to one fuse.

7. The semiconductor device according to claim 1, wherein a plurality of the fuses are arrayed in a given region.

8. The semiconductor device according to claim 6, wherein a plurality of the fuses are arrayed in a given region.

9. The semiconductor device according to claim 1, wherein the protective member has a pillar-shaped form, an end of one side of the protective member contacting the fuse and an end of another side of the protective member contacting the first insulating film.

10. A semiconductor device comprising:

a semiconductor substrate;

a first insulating film formed on the semiconductor substrate;

a fuse formed on the first insulating film;

a protective member formed of a stronger material than that of the first insulating film and disposed under the fuse with the fuse contacting the protective member;

a second insulating film formed on both of the first insulating film and the fuse;

wiring formed on the second insulating film; and a via contact portion formed inside the second insulating film to connect the fuse and the wiring electrically, the protective member being made of the same material as that of the via contact portion.

11. A method of disconnecting a fuse of a semiconductor device, the semiconductor device including a semiconductor substrate, a first insulating film formed on the semiconductor substrate, wiring formed on the first insulating film, a second insulating film formed on both of the first insulating film and the wiring, a fuse formed on the second insulating film, a via contact portion formed inside the second insulating film to connect the fuse and the wiring electrically, and a plurality of protective members formed by stronger material than the second insulating film and disposed separately from one another under the fuse, wherein the fuse is disconnected by irradiating a laser onto at least one portion directly above the protective member out of the plurality of protective members.

12. A method of disconnecting a fuse of a semiconductor device, the semiconductor device including a semiconductor substrate, a first insulating film formed on the semiconductor substrate, wiring formed on the first insulating film, a second insulating film formed on both of the first insulating film and the wiring, a fuse formed on the second insulating film, a via contact portion formed inside the second insulating film to connect the fuse and the wiring electrically, and a plurality of protective members formed by stronger material than the second insulating film and disposed separately from one another under the fuse, wherein the fuse is disconnected by irradiating a laser onto a portion of the fuse between the plurality of protective members.

13. A method of forming a semiconductor device, comprising:

forming a semiconductor substrate;

forming a first insulating film on the semiconductor substrate;

forming lower wiring on the first insulating film;

forming a second insulating film on both the first insulating film and the lower wiring;

forming a fuse on the second insulating film;

forming a via contact portion inside the second insulating film to electrically connect the fuse and the lower wiring; and forming a protective member, of a stronger material than that of the second insulating film, under the fuse with the fuse contacting the protective member.

* * * * *